United States Patent
Kimmig et al.

(10) Patent No.: US 8,180,309 B2
(45) Date of Patent: May 15, 2012

(54) LOCK-IN AMPLIFIER AND METHOD FOR FILTERING A MEASUREMENT SIGNAL USING SUCH AN AMPLIFIER

(75) Inventors: Ludwig Kimmig, Ettlingen (DE); Peter Krause, Karlsruhe (DE); Michael Ludwig, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 276 days.

(21) Appl. No.: 12/594,417

(22) PCT Filed: Mar. 20, 2008

(86) PCT No.: PCT/EP2008/053406
§ 371 (c)(1),
(2), (4) Date: Mar. 3, 2010

(87) PCT Pub. No.: WO2008/119680
PCT Pub. Date: Oct. 9, 2008

(65) Prior Publication Data
US 2010/0188149 A1    Jul. 29, 2010

(30) Foreign Application Priority Data
Apr. 2, 2007  (DE) .......................... 10 2007 015 913

(51) Int. Cl.
*H04B 1/10* (2006.01)
*H04K 3/00* (2006.01)
(52) U.S. Cl. ........................................ 455/295; 455/296
(58) Field of Classification Search ................ 455/226.1, 455/226.2, 295, 296, 303, 304, 306; 375/346
See application file for complete search history.

(56) References Cited

U.S. PATENT DOCUMENTS

| 6,055,318 A | 4/2000 | Whitecar |
| 2005/0189951 A1* | 9/2005 | Ibrahim et al. ................ 324/616 |

FOREIGN PATENT DOCUMENTS

| DE | 637 480 A | 10/1936 |
| DE | 26 46 184 A1 | 4/1978 |
| DE | 103 49 368 B4 | 5/2005 |
| DE | 10 2004 026 271 B3 | 12/2005 |

(Continued)

OTHER PUBLICATIONS

M. Laguesse, "Les Techniques De Demodulation Synchrone: Principes De Base Et Caracteristiques Generales", Bulletin Scientifique—Association Des Ingenieurs Electricienssortis De L'Institut Electrotechnique Motefiore, Liege, BE, vol. 103, No. 4, Jan. 1, 1990, pp. 3-9.

(Continued)

*Primary Examiner* — Lee Nguyen

(57) ABSTRACT

A lock-in amplifier with an additional phase-sensitive detector is provided. A measurement signal is mixed in a multiplicative fashion with a reference signal, which is phase-shifted by 90 degrees, for a modulation frequency. In order to reliably filter out interference signal portions in a widest possible dynamic range and, at the same time, minimize unavoidable influence on the useful signal portion, a control device is connected downstream of the additional phase-sensitive detector. The control device determines a control variable corresponding to the strength of the interference signal from the measurement signal mixed with the reference signal phase shifted by 90 degrees and uses the control variable to change the integration duration of the integrator proportionally to the control variable, a corresponding cut-off frequency of an equivalent low pass being coordinated automatically.

4 Claims, 1 Drawing Sheet

FOREIGN PATENT DOCUMENTS

| EP | 0 119 711 A1 | 9/1984 |
|---|---|---|
| EP | 0955 727 A2 | 11/1999 |

OTHER PUBLICATIONS

Maximiliano Osvaldo Sonnaillon and Fabian Jose Bonetto, "A low-cost, high-performance, digital signal processor-based lock-in amplifier capable of measuring multiple frequency sweeps simultaneously", Review of Scientific Instruments, AIP, Melville, NY, US, vol. 76, No. 2, Jan. 20, 2005, pp. 24703-024703.

A. Gnudi, L. Colalongo and G. Baccarani, "Integrated Lock-In Amplifier for Sensor Applications", Solid-State Circuits Conference, 1999, ESSCIRC '99, Proceedings of the 25$^{th}$ European Duisburg, Germany, Sep. 2123, 1999, Piscataway, NJ, US, IEEE, Sep. 21, 1999, pp. 58-61.

Technical University of Berlin, "Signalverarbeitung mit Lock-in-Verstärker", (Signal processing withlock-in amplifier), Institute for Solid State Physics, online on the Internet: URL: http://sol.physik.tu-berlin.de/htm_group/teaching/scripte/LockIn204.pdf, dated Mar. 23, 2007.

* cited by examiner

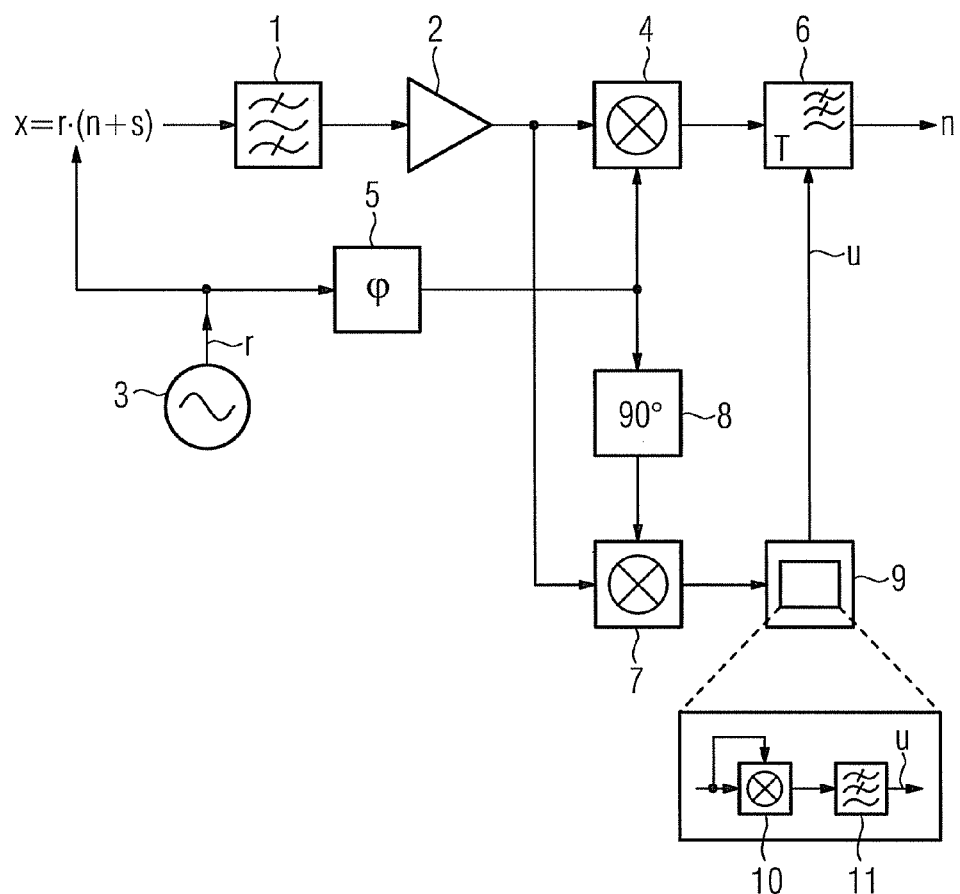

LOCK-IN AMPLIFIER AND METHOD FOR FILTERING A MEASUREMENT SIGNAL USING SUCH AN AMPLIFIER

CROSS REFERENCE TO RELATED APPLICATIONS

This application is the US National Stage of International Application No. PCT/EP2008/053406 filed Mar. 20, 2008, and claims the benefit thereof. The International Application claims the benefits of German Application No. 10 2007 015 913.9 DE filed Apr. 2, 2007, both of the applications are incorporated by reference herein in their entirety.

FIELD OF INVENTION

The invention relates to a lock-in amplifier and a method for filtering a measurement signal using a lock-in amplifier.

BACKGROUND OF INVENTION

A lock-in amplifier of this type and a method of this type are known from the internship course material "Signalverarbeitung mit Lock-in-Verstärker" ["Signal processing with lock-in amplifier"] by the institute for solid state physics from the Technical University of Berlin. A modulated measurement signal, which contains signal components, in particular noise, is multiplied in a phase-sensitive detector (demodulator) with a reference signal for the modulation frequency and is therefore demodulated in a phase-sensitive manner. The demodulated measurement signal is subsequently integrated in an integrator (low-pass filter) over a predetermined integration duration (filter time constant) in order to extract the useful signal component of the measurement signal from the interference signal components.

SUMMARY OF INVENTION

As the amplitude of the filtered out useful signal component (in-phase component) is dependent on the phase difference between the modulation frequency and the frequency of the reference signal and a readjustment of the phase difference to zero is often not practical, in the case of a two-phase lock-in amplifier the measurement signal is also mixed in a further phase-sensitive detector in a multiplicative fashion with the reference signal phase shifted by 90 degrees for the modulation frequency and is subsequently integrated in a further integrator over a predetermined integration duration. The useful signal component can be determined in a non-phase-relation fashion from the quadrature component and in-phase component thus obtained.

With the afore-cited integration of the demodulated measurement signal, the selection of the integration duration represents a compromise between the elimination of all possible interference signal components, but also those interference signal components, the frequency of which lies close to the modulation frequency, and as rapid a response of the lock-in amplifier as possible to changes in the useful signal component of the measurement signal.

An object of the invention is to reliably filter out the interference signal components in the widest possible dynamic range and at the same time to minimize the unavoidable influence on the useful signal component.

In accordance with the invention, the object is achieved by the lock-in amplifier and the method as claimed in the independent claims.

Advantageous developments of the inventive lock-in amplifier and the method can be inferred from the dependent claims.

The invention relates to the knowledge that the in-phase component generated by mixing the measurement signal with the reference signal contains both the useful signal component as well as the interference signal components, while the quadrature component generated by mixing the measurement signal with the reference signal phase shifted by 90 degrees approximately only contains the interference signal components. The quadrature component therefore enables the degree of interference to be quantitatively detected and furthermore enables the integration duration to be optimally adjusted when filtering out the useful signal component as a function of the degree of the interferences.

The interference signal strength and/or energy of the interference signal components can be advantageously determined such that the measurement signal mixed with the reference signal phase shifted by 90 degrees is firstly squared and then integrated over a fixed integration duration.

BRIEF DESCRIPTION OF THE DRAWINGS

To further describe the invention, reference is made to the single FIGURE in the drawing, which indicates an exemplary embodiment of the inventive lock-in amplifier.

DETAILED DESCRIPTION OF INVENTION

The lock-in amplifier shown here contains a bandpass filter 1 and an amplifier 2 for prefiltering and amplifying a measurement signal x. The measurement signal x consisting of a useful signal component n and interference signal components s is modulated, i.e. it is modulated periodically by itself or is modulated by force. The term measurement signal is also understood to mean a non-electric measurement variable, which is modulated and then converted into an electrical signal. A reference signal generator 3 generates a reference signal r with the same frequency as the modulation frequency of the measurement signal x. In this way and as shown here, the reference signal r itself can be used to modulate the measurement signal x or can be derived from the modulated measurement signal x. The bandpass-filtered and amplified measurement signal x is multiplied in a phase-sensitive detector 4 with the reference signal r and is therefore demodulated in a phase-sensitive fashion. To this end, the reference signal r may pass through a phase shifter 5 beforehand, in order to enable a phase matching between the reference signal r and the measurement signal x. The demodulated measurement signal is then integrated in an integrator 6 over a predetermined integration duration T in order to extract the useful signal component n of the measurement signal x from the interference signal components s.

The interference signal components s can in addition to noise also contain sporadically occurring interferences, produced for instance as a result of agitation. To remove such interferences from the measurement signal x, a relatively large integration duration T is needed for the integration in the integrator 6. On the other hand, the lock-in amplifier nevertheless responds relatively slowly to modifications to the useful signal component n of the measurement signal x during a large integration duration T.

The bandpass-filtered and amplified measurement signal x is thus multiplied in a further phase-sensitive detector 7 with the reference signal r phrase shifted beforehand by 90 degrees in a further phase shifter 8 and is subsequently initially squared in a control device 9 with corresponding means 10 and 11 and is then integrated over a predetermined integration duration. In this way a control variable u is determined, which is a measure of the interference signal strength of the interference signal components s and with which the integration duration T of the integrator 6 is modified, by the integration duration T being enlarged with increasing interference signal strength and the integration duration T being reduced with a decreasing interference signal strength.

The invention can be applied equally in one-phase and two-phase lock-in amplifiers. The signal processing can take place in an analog or digital fashion, with the integrator and low pass filter and/or integration duration and filter time constant being understood as synonyms.

The filtering of the measurement signal x with the inventive lock-in amplifier can be effected for instance as follows: the modulation of the measurement signal x or the phase shift (phase shifter 5) of the reference signal r are adjusted in a coordination step in the absence of sporadic interferences such that the measurement signal x (quadrature component) multiplied with the reference signal r phase shifted by 90 degrees is zero. The integration duration T of the integrator 6 for the in-phase component is defined on a basic value of 1 s for instance, whereby the requirements for the useful/interference signal ratio are observed. The integration duration of the additional integrator 11 is likewise defined on a basic value (e.g. 1 s). The control variable u corresponding to the interference signal strength is standardized to one. Furthermore, the basic value of the integration duration T of the integrator 6 is multiplied with the control variable u in order to adjust the integration duration T of the integrator 6. If the interference signal level increases to twice the standard value, the integration duration T quadruples to 4 s as a result of the squaring in the means 10. In the case of an integrator 6 embodied as a low pass filter of the first order, the quadruplication of the integration duration and/or filter time constants T produces a halving of the noise so that the useful/interference signal ratio is maintained.

The invention claimed is:

1. A lock-in amplifier, comprising:
    a phase-sensitive detector;
    an integrator arranged downstream of the phase-sensitive detector, wherein interference signal components, which are contained in a modulated measurement signal, are eliminated by mixing the measurement signal with a reference signal in a multiplicative fashion for a modulation frequency and are eliminated by subsequent integration over a predetermined integration duration;
    a further phase-sensitive detector, the measurement signal being mixed in the further phase-sensitive detector in a multiplicative fashion with the reference signal phase shifted by 90 degrees for the modulation frequency; and
    a control device arranged downstream of the further phase-sensitive detector, wherein the control device determines a control variable corresponding to an interference signal strength from the measurement signal mixed with the reference signal phase shifted by 90 degrees and changes the integration duration of the integrator using the control variable, the integration duration being changed proportionally to the control variable.

2. The lock-in amplifier as claimed in claim 1, wherein the control device includes squaring means and integrating means for squaring and subsequently integrating the measurement signal mixed with the reference signal phase shifted by 90 degrees.

3. A method for filtering a modulated measurement signal, comprising:
    providing a modulated measurement signal;
    eliminating interference signal components included in the modulated measurement signal by multiplicative mixing of the measurement signal with a reference signal for a modulation frequency and by subsequent integrating over a predetermined integration duration;
    mixing the measurement signal with the reference signal phase shifted by 90 degrees in a multiplicative fashion for the modulation frequency;
    determining a control variable corresponding to an interference signal strength based upon the measurement signal mixed with the reference signal phase shifted by 90 degrees; and
    changing the integration duration by using the control variable, wherein the integration duration is changed proportionally to the control variable.

4. The method as claimed in claim 3, wherein the measurement signal mixed with the reference signal phase shifted by 90 degrees is squared and then integrated to determine the control variable.

* * * * *